(12) United States Patent
Chuang et al.

(10) Patent No.: US 7,776,640 B2
(45) Date of Patent: Aug. 17, 2010

(54) IMAGE SENSING DEVICE AND PACKAGING METHOD THEREOF

(75) Inventors: Cheng-Lung Chuang, Tao-Yuan Hsien (TW); Chi-Cheng Lin, Tao-Yuan Hsien (TW)

(73) Assignee: Tong Hsing Electronic Industries Ltd., Taipei (TW)

( * ) Notice: Subject to any disclaimer, the term of this patent is extended or adjusted under 35 U.S.C. 154(b) by 141 days.

(21) Appl. No.: 12/232,936

(22) Filed: Sep. 26, 2008

(65) Prior Publication Data

US 2010/0078747 A1    Apr. 1, 2010

(51) Int. Cl.
*H01L 21/20* (2006.01)
(52) U.S. Cl. ............ 438/64; 438/67; 438/107; 438/108; 438/116; 438/123; 257/432; 257/434; 257/680; 257/686; 257/725; 257/E21.205; 257/E21.536; 257/E23.069; 257/E23.179; 257/E31.011; 257/E31.127; 257/E33.076
(58) Field of Classification Search ............. 438/64–67, 438/107–123; 257/432–434, 680–686, 725–728, 257/784–789, E21.001, 205, 536, E23.009, 257/179, E31.001, 11, 127, E33.076
See application file for complete search history.

(56) References Cited

U.S. PATENT DOCUMENTS

| | | | |
|---|---|---|---|
| 4,941,255 A * | 7/1990 | Bull | 29/833 |
| 6,399,418 B1 * | 6/2002 | Glenn et al. | 438/106 |
| 6,528,857 B1 * | 3/2003 | Glenn et al. | 257/433 |
| 6,545,332 B2 * | 4/2003 | Huang | 257/433 |
| 6,586,824 B1 * | 7/2003 | Glenn et al. | 257/680 |
| 6,603,183 B1 * | 8/2003 | Hoffman | 257/434 |
| 6,649,834 B1 * | 11/2003 | Hsieh et al. | 174/527 |
| 6,649,991 B1 * | 11/2003 | Chen et al. | 257/433 |
| 6,934,065 B2 * | 8/2005 | Kinsman | 359/245 |
| 6,983,537 B2 * | 1/2006 | Park | 29/840 |
| 7,250,324 B2 * | 7/2007 | Hsieh et al. | 438/64 |
| 2004/0113049 A1 * | 6/2004 | Hsieh et al. | 250/208.1 |
| 2004/0148772 A1 * | 8/2004 | Hsieh et al. | 29/855 |
| 2005/0013098 A1 * | 1/2005 | Hsin | 361/679 |
| 2006/0192230 A1 * | 8/2006 | Wood et al. | 257/234 |
| 2006/0192279 A1 * | 8/2006 | Tsai et al. | 257/686 |
| 2006/0268144 A1 * | 11/2006 | Tan et al. | 348/340 |
| 2007/0164386 A1 * | 7/2007 | Chang et al. | 257/434 |
| 2008/0079105 A1 * | 4/2008 | Chang et al. | 257/434 |
| 2008/0278617 A1 * | 11/2008 | Tanida et al. | 348/340 |
| 2009/0224344 A1 * | 9/2009 | Huang et al. | 257/432 |
| 2009/0256222 A1 * | 10/2009 | Hsu | 257/432 |

* cited by examiner

*Primary Examiner*—Michael S Lebentritt
(74) *Attorney, Agent, or Firm*—Bacon & Thomas, PLLC

(57) ABSTRACT

An image sensing device and a packaging method thereof is disclosed. The packaging method includes the steps of providing an adhesive layer; placing a substrate, having an opening, on the adhesive layer; disposing an image sensor within the opening on the adhesive layer; adding a filler between the image sensor and the substrate; connecting the image sensor and the substrate via a plurality of bonding wires; and removing the adhesive layer.

30 Claims, 11 Drawing Sheets

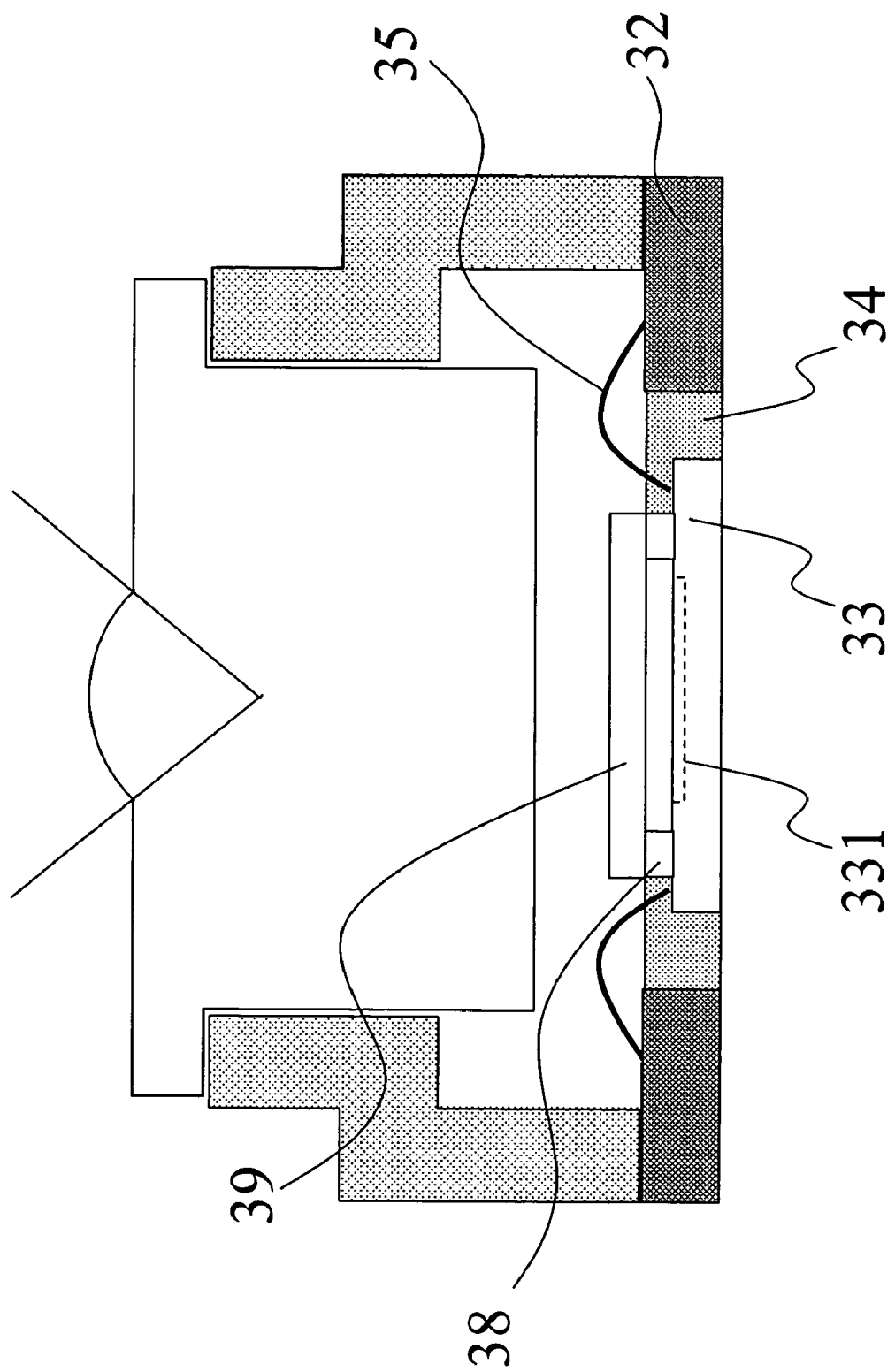

IMAGE SENSING DEVICE AND PACKAGING METHOD THEREOF

FIELD OF THE INVENTION

The present invention relates to a semiconductor packaging method, and more particularly, to a packaging method of an image sensing device.

BACKGROUND OF THE INVENTION

In recent years, solid-state image sensors such as charge coupled devices (CCDs) or complementary metal oxide semiconductor (CMOS) image sensors have been widely applied to electronic products for converting light into electrical signals. The applications of image sensor components include monitors, cell phones, scanners, digital cameras, and so on. Currently, these applications tend to have an overall size which is smaller and thinner so that it can be carried around easily.

Conventionally, these sensors have been packaged for use by mounting them to a substrate and enclosing them within a housing assembly. For example, U.S. Pat. No. 6,268,231 discloses a CCD package 10 as shown in FIG. 1. The CCD package 10 includes a plastic base structure 12 for support beneath a flexible circuit board 18. Electrical conductors are formed upon flexible circuit board 18. Plastic ring frame 14 is placed on top of the flexible circuit board 18 creating a sandwich area defined by the base structure 12 and plastic ring frame 14 with flexible circuit 18 in between. The plastic ring frame 14 provides depth for an image sensor to be contained therein. The image sensor electrical connectors that make electrical contact with conductor pattern on the flexible circuit 18. The ring frame 14 provides support for a glass cover 16 that provides isolation from ambient conditions for the enclosed CCD while allowing light to pass and become incident upon the CCD. The plastic base structure 12, circuit board 18 and ring frame 14, not to mention the glass cover 16, overall forms a relatively thick package.

Similarly, U.S. Pat. Nos. 6,034,429, 6,268,654 and 6,143,588 also disclose a CCD package including an IC die mounted on and wire bonded to a first side of a BT substrate, a bead or dam formed in varying manners around the IC die, a glass lid attached to the bead, and solder balls attached to a second side of the BT substrate. All of these packages are relatively thick and are limited by the thickness of the substrate.

Therefore, a packaging method of an image sensing device having a reduced size and thickness is desperately desired so as to fit within those aforementioned smaller and thinner applications.

SUMMARY OF THE INVENTION

Accordingly, the prior arts are limited by the above problems. It is an object of the present invention to provide a packaging method of an image sensing device having a reduced size and thickness.

In accordance with an aspect of the present invention, a packaging method for an image sensing device, includes the steps of providing an adhesive layer; placing a substrate, having an opening, on the adhesive layer; disposing an image sensor within the opening on the adhesive layer; adding a filler between the image sensor and the substrate; connecting the image sensor and the substrate via a plurality of bonding wires; and removing the adhesive layer.

Preferably, the image sensor includes a light-receiving region exposed.

Preferably, the packaging method further includes between the disposing step and the adding step a step of forming a barrier around the light-receiving region on the image sensor.

Preferably, the packaging method further includes a step of laying a transparent lid on the barrier above the light-receiving region.

Preferably, the barrier is formed by transfer molding, pot molding, injection molding, photolithographic process, exposure development process, laser cutting process, or stereolithographic process.

Preferably, the barrier is defined by a photoresist mask.

Preferably, the barrier is made of epoxy resin, solder mask, or photoresist.

Preferably, the filler is added between the barrier and the substrate with the plurality of bonding wires being encapsulated.

Preferably, the filler is added between the barrier and the substrate with the plurality of bonding wires being exposed.

Preferably, the image sensor includes complementary metal oxide semiconductor (CMOS) image sensor or charge coupled device (CCD) image sensor.

Preferably, the substrate includes aluminum nitride ceramic, fiberglass-reinforced epoxy resin, or bismaleimide-triazine resin.

Preferably, the packaging method further includes a step of mounting a lens holder on the substrate above the image sensor.

Preferably, the packaging method further includes a step of setting a lens on the lens holder.

Preferably, the adhesive layer comprises boron, amorphous silicon, carbon, tantalum nitride, or titanium nitride.

Preferably, the adhesive layer is removed by imposing heat on the adhesive layer to melt an adhesive adhered between the substrate and the image sensor.

Preferably, the adhesive layer is removed by chemical etching to dissolve an adhesive adhered between the substrate and the image sensor.

Preferably, the adhesive layer is a tape.

In accordance with another aspect of the present invention, an image sensing device includes a substrate having an opening; an image sensor disposed within the opening of the substrate; a plurality of bonding wires for connecting the image sensor and the substrate; and a filler between the image sensor and the substrate.

Preferably, the image sensor includes complementary metal oxide semiconductor (CMOS) image sensor or charge coupled device (CCD) image sensor.

Preferably, the substrate includes aluminum nitride ceramic, fiberglass-reinforced epoxy resin, or bismaleimide-triazine resin.

Preferably, the image sensing device further includes a lens holder mounted on the substrate above the image sensor.

Preferably, the image sensing device further includes a lens disposed on the lens holder.

Preferably, the image sensor includes a light-receiving region exposed.

Preferably, the image sensing device further includes a barrier formed around the light-receiving region on the image sensor.

Preferably, the image sensing device further includes a transparent lid laid on the barrier above the light-receiving region.

Preferably, the barrier is formed by transfer molding, pot molding, injection molding, photolithographic process, exposure development process, laser cutting process, or stereolithographic process.

Preferably, the barrier is defined by a photoresist mask.

Preferably, the barrier is made of epoxy resin, solder mask, or photoresist.

Preferably, the filler is between the barrier and the substrate with the plurality of bonding wires being encapsulated.

Preferably, the filler is between the barrier and the substrate with the plurality of bonding wires being exposed.

BRIEF DESCRIPTION OF THE DRAWING

The above objects and advantages of the present invention will become more readily apparent to those ordinarily skilled in the art after reviewing the following detailed description and accompanying drawings, in which:

FIG. 3 illustrates a second embodiment of an image sensing device according to the present invention.

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
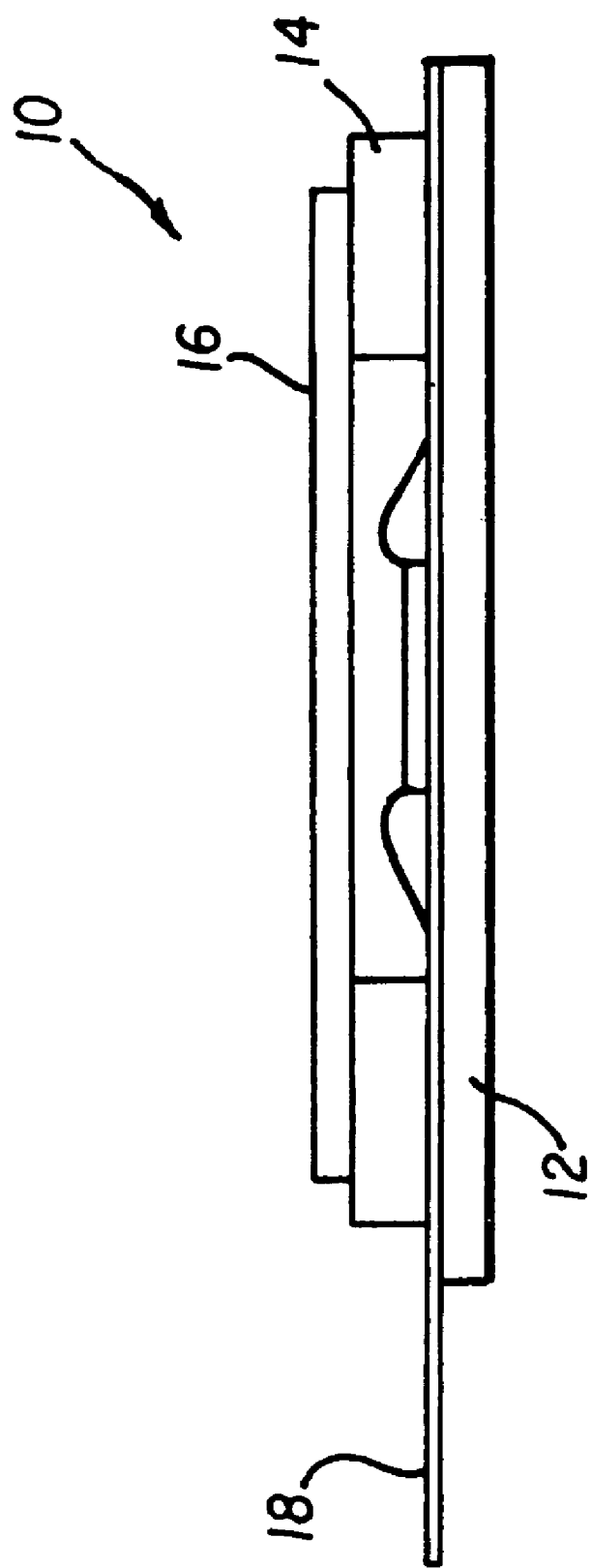
FIG. 1 illustrates an image sensing device according to the prior art.
Figure 2A:
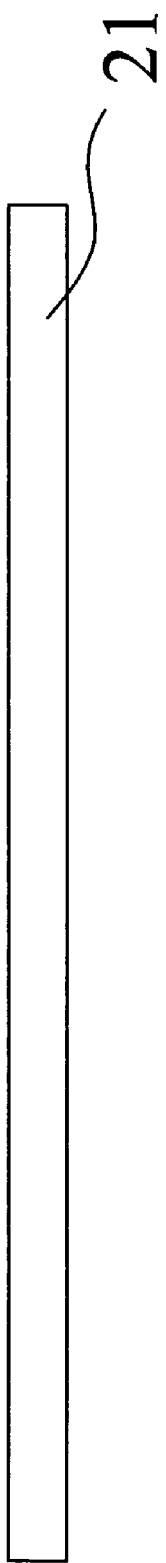
FIGS. 2A-2H illustrate a packaging method of a first embodiment of an image sensing device according to the present invention.
Figure 2B:
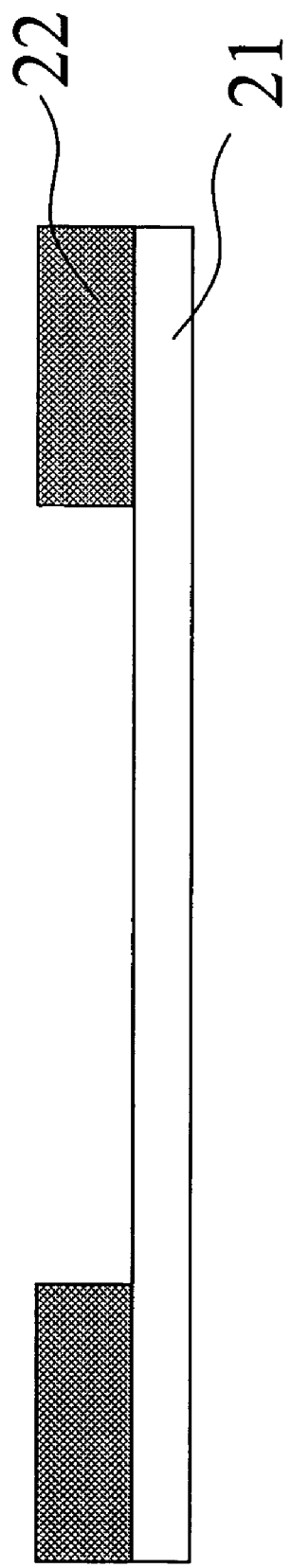

Please refer to FIGS. 2A-2H. They illustrate a packaging method of a first embodiment of an image sensing device according to the present invention. First, in FIG. 2A, an adhesive layer 21 is provided as a base, and then a substrate 22 having an opening is placed on the adhesive layer 21, as shown in FIG. 2B. The substrate 22 could be made of plastic, fiberglass-reinforced epoxy resin, aluminum nitride ceramic, or bismaleimide-triazine resin.

Figure 2C:
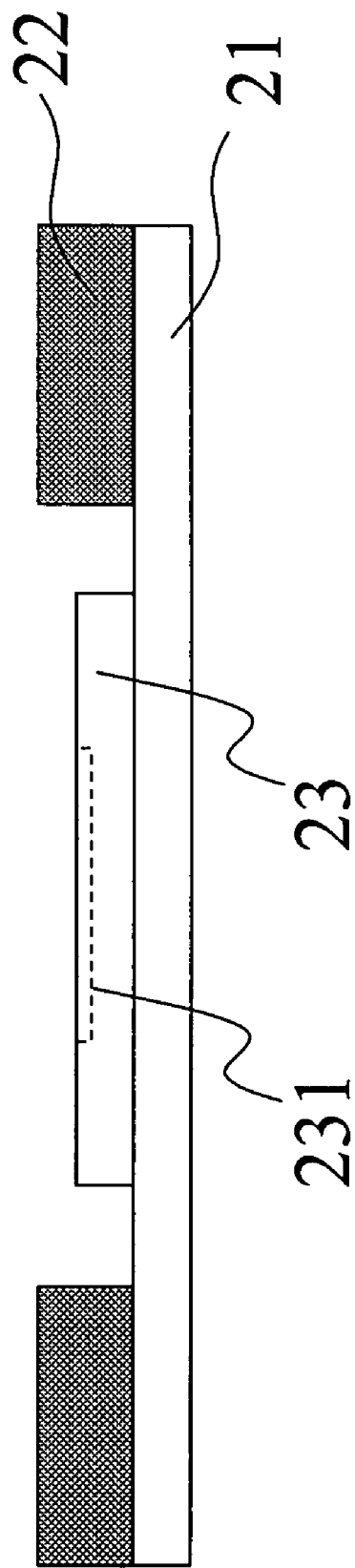

Later, an image sensor 23 having a light-receiving region 231 exposed is disposed on the adhesive layer 21 within the opening of the substrate 22, as shown in FIG. 2C. The image sensor 23 may be a complementary metal oxide semiconductor (CMOS) image sensor or a charge coupled device (CCD) image sensor.

In the present invention, the adhesive layer 21 is used to provide a supporting surface for the image sensor 23 which is traditionally performed by a substrate. In this case, the adhesive layer 21 is made of dielectric material such as boron, amorphous silicon, carbon, tantalum nitride, or titanium nitride. Preferably, the adhesive layer can be a tape.

Figure 2D:
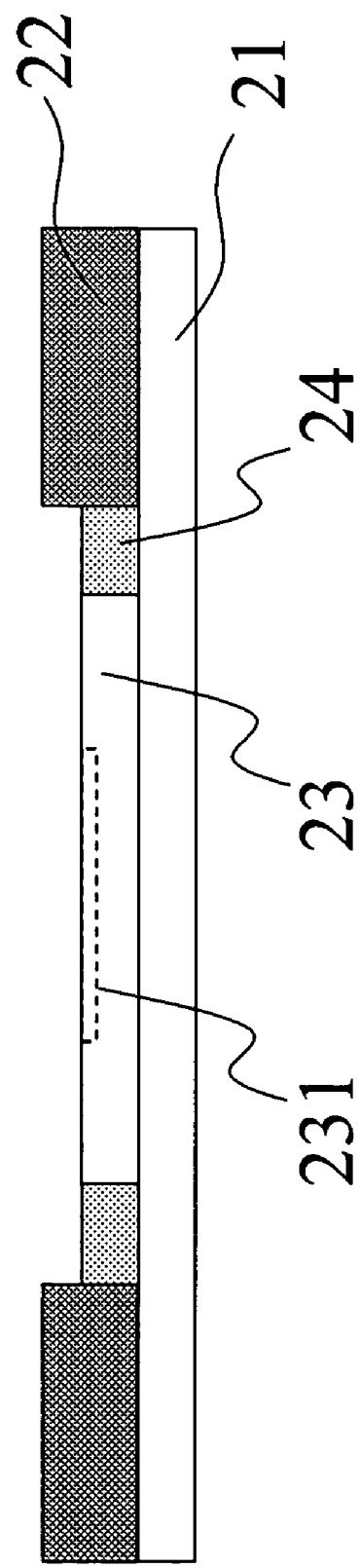
Figure 2E:
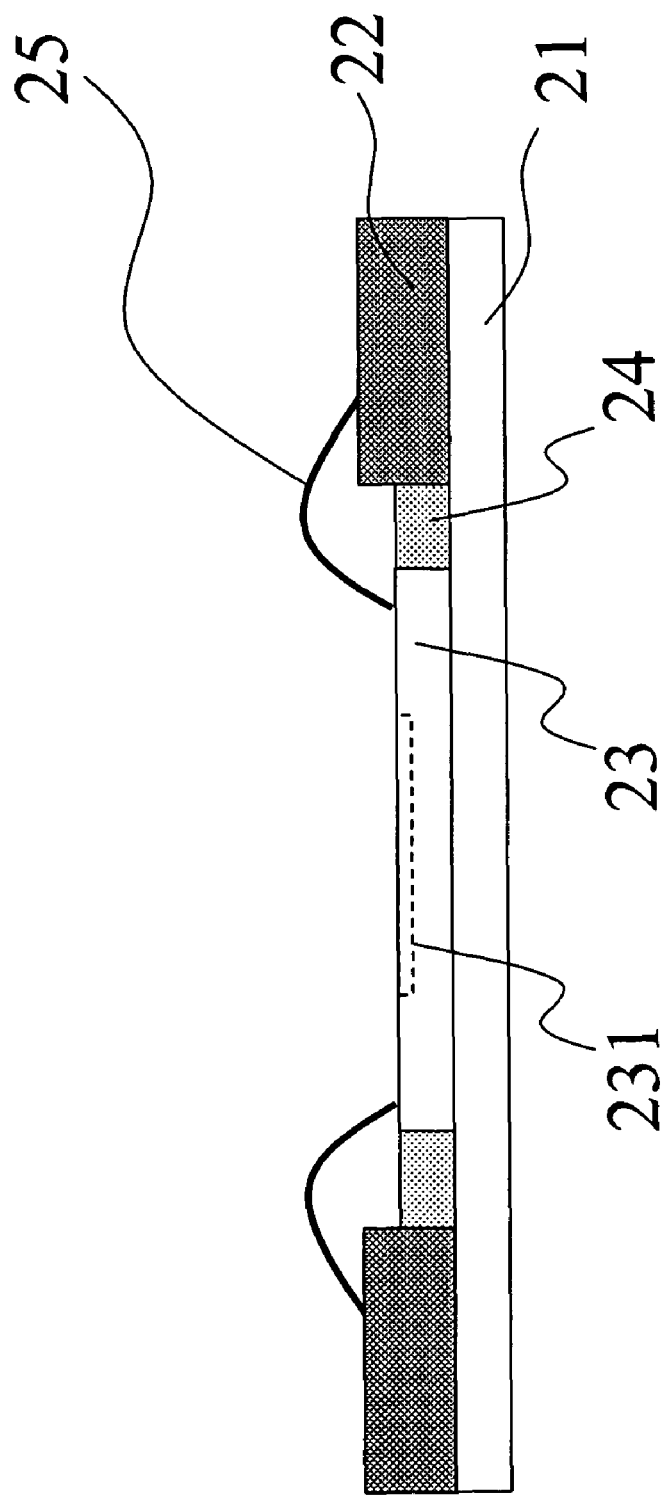

After the image sensor 23 is positioned, a filler 24 is added into a gap formed between the image sensor 23 and the substrate 22 for physically connecting the image sensor 23 and the substrate 22 together, as shown in FIG. 2D. In other words, the filler 24 is added into the opening of the substrate 22 leaving the image sensor 23 uncovered. Then, the image sensor 23 and the substrate 22 are electrically connected by several bonding wires 25, as shown in FIG. 2E.

Figure 2F:
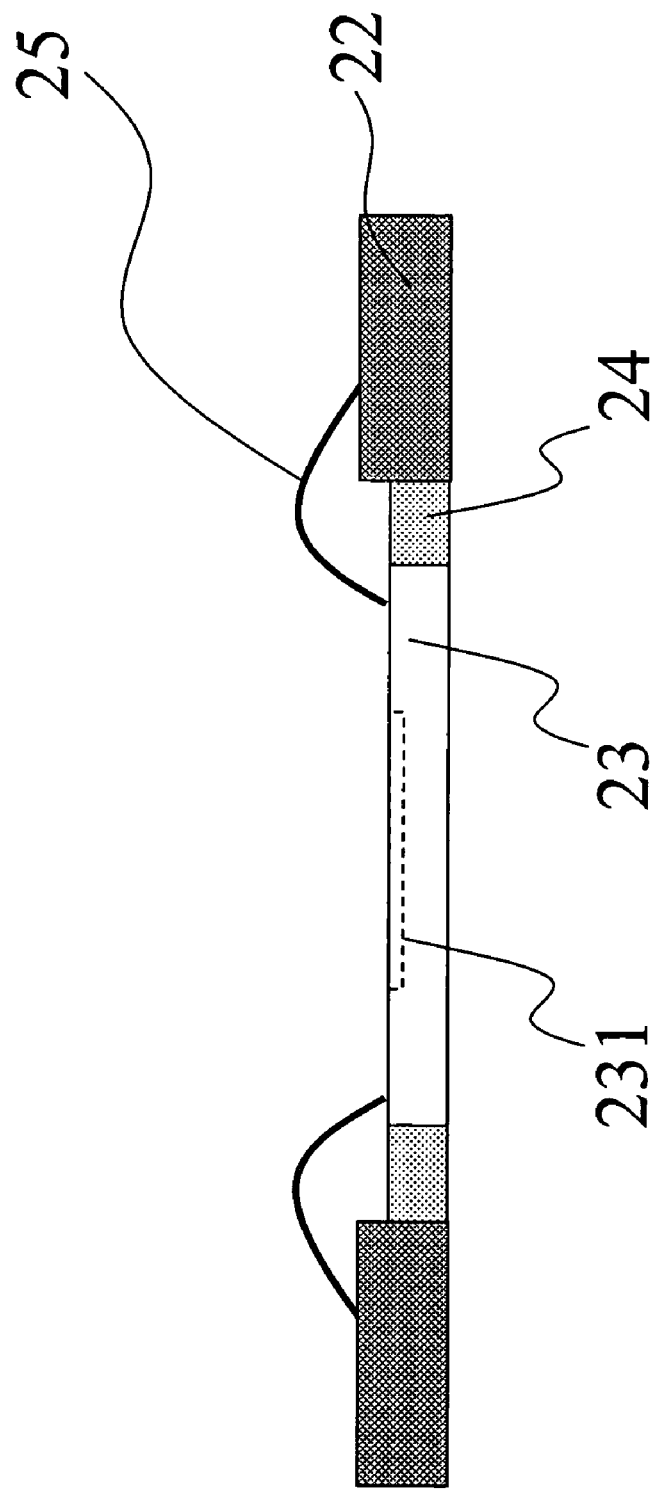

Once the image sensor 23 and the substrate 22 are physically and electrically connected, there will be no further need for the supporting of the adhesive layer 21, and therefore, the adhesive layer 21 is then removed, thereby causing a significant reduce in a overall thickness of the image sensing device, as shown in FIG. 2F.

The removal of the adhesive layer 21 can be achieved in several different ways. For example, the adhesive layer 21 can be removed by imposing heat to the adhesive layer 21 to melt an adhesive adhered between the substrate 22 and the image sensor 23. A temperature ranging from about 60° C. to 90° C. is preferable. The adhesive layer 21 can also be removed by chemical etching to dissolve an adhesive adhered between the substrate 22 and the image sensor 23. The etchant used for chemical etching may be a sulfuric acid solution or an organic solvent. However, the etchant used should be non-reactive with the filler 24, or else, the filler 24 will also be removed at the same time. Hence, the filler 24 should have a material different from that of the adhesive layer 21. Furthermore, the adhesive layer 21 can also be ripped off as a tape manually or mechanically if the filler 24 is sensitive to heat or reactive to the etchant, and the aforementioned methods of removing the adhesive layer 21 can not be performed.

Figure 2G:
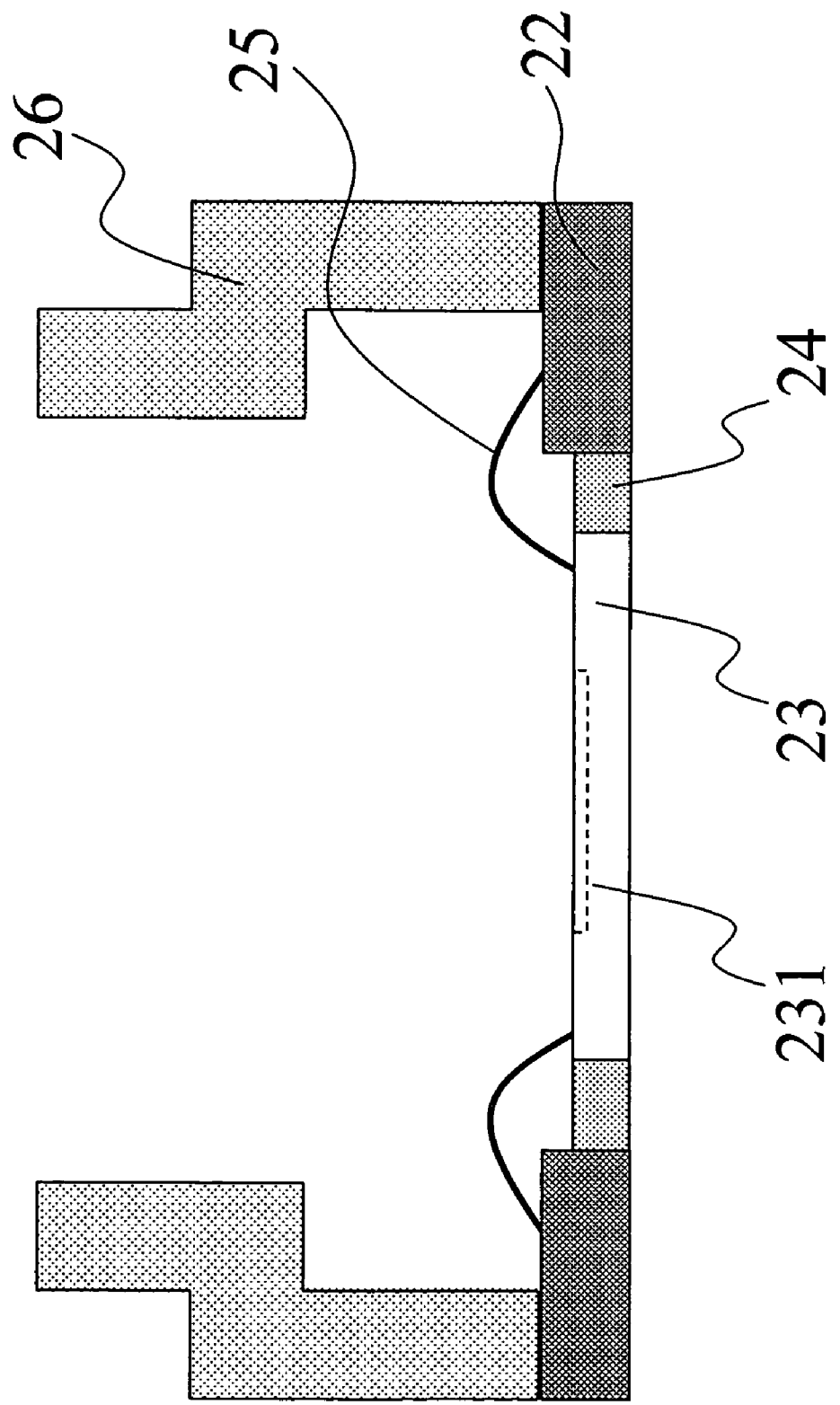
Figure 2H:
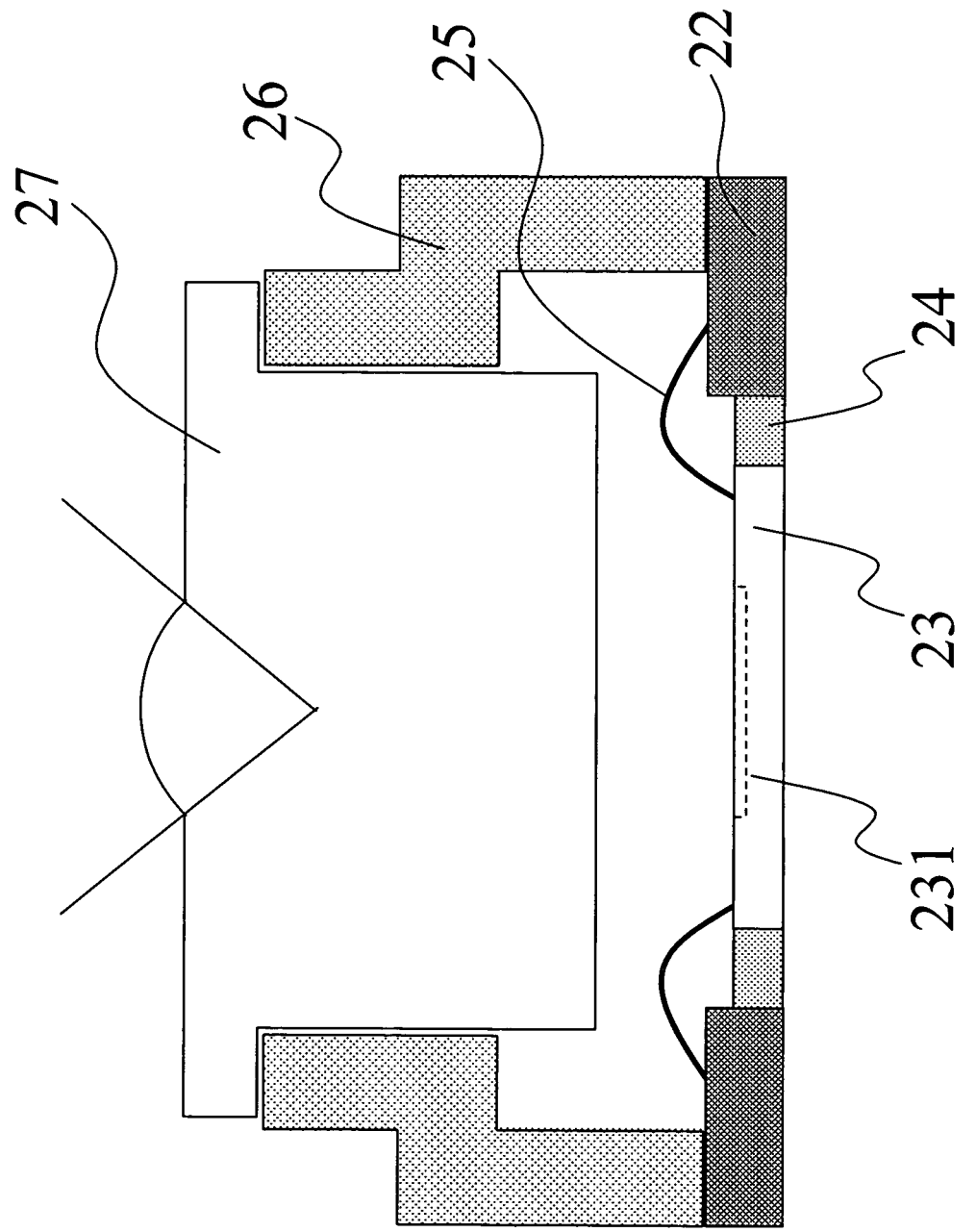

After that, a lens holder 26 can be mounted directly on the substrate 22 above the image sensor 23, as shown in FIG. 2G, and then a lens 27 is finally disposed on the lens holder 26, as shown in FIG. 2H.

In this first embodiment, the filler 24 is added into the gap formed between the image sensor 23 and the substrate 22. However, it should be noted that the filler 24 is not limited thereto, it can also be added as shown in FIGS. 3 and 4.

Please refer to FIG. 3. FIG. 3 illustrates a second embodiment of an image sensing device according to the present invention. In the second embodiment, an image sensor 33 having a light-receiving region 331 is disposed within an opening of a substrate 32. The image sensor 33 is electrically connected to the substrate 32 by several bonding wires 35. Then, a barrier 38 is formed on the image sensor 33 around the light-receiving region 331. After that, a filler 34 is added between the barrier 38 and the substrate 32, leaving the bonding wires 35 being exposed.

The barrier 38 is used to prevent the light-receiving region 331 from being accidentally covered by the filler 34. The barrier 38 is usually made of epoxy resin, solder mask, or photoresist, and can be formed by transfer molding, pot molding, injection molding, photolithographic process, exposure development process, laser cutting process, or stereolithographic process. Due to the fact that the barrier 38 has a certain volume and height, the barrier 38 is usually defined by a photoresist mask. Later, a transparent lid 39 is laid on the barrier 38 above the light-receiving region 331 for protecting the light-receiving region 331 from being damaged or polluted.

Figure 4:
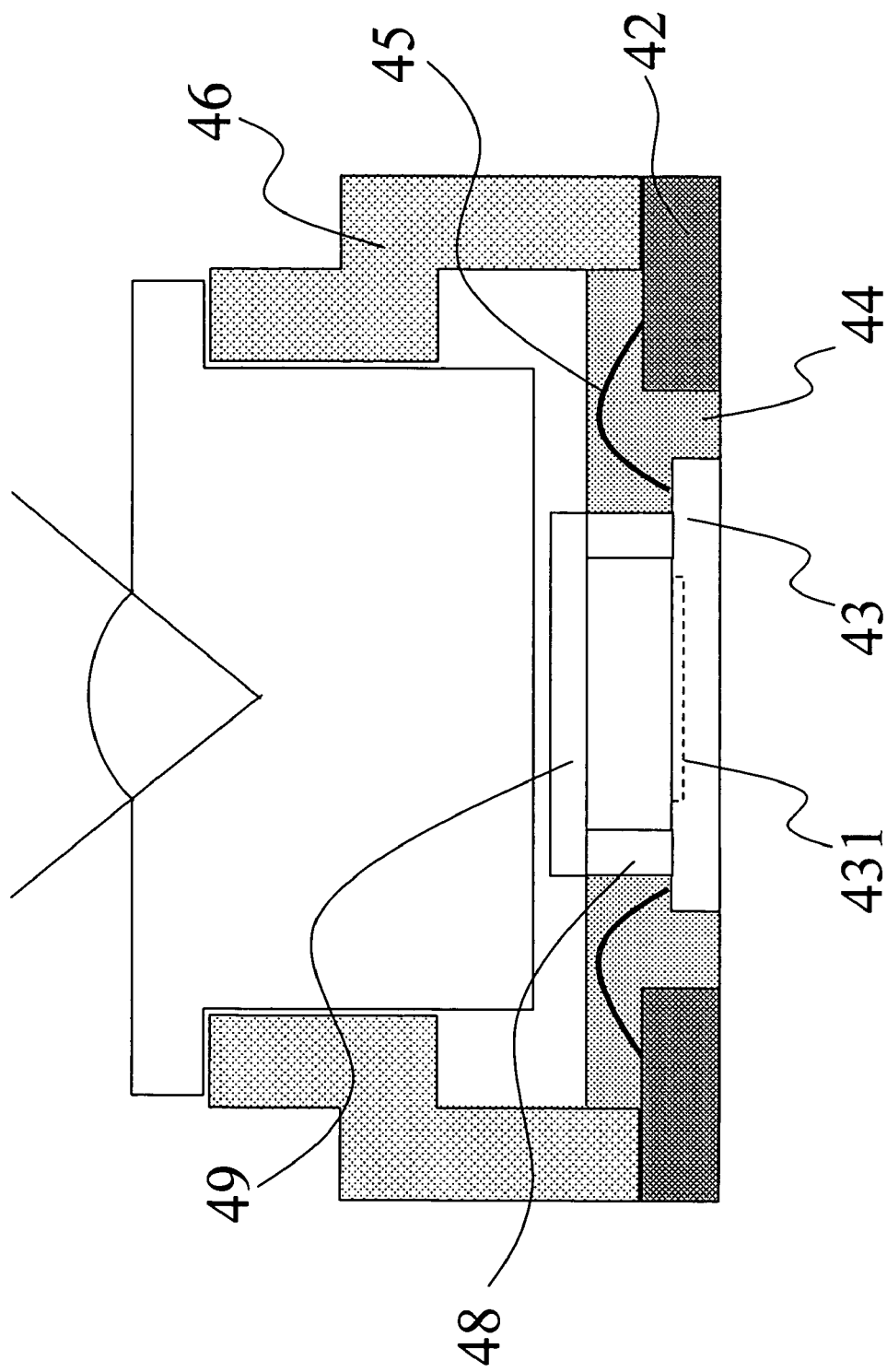
FIG. 4 illustrates a third embodiment of an image sensing device according to the present invention.

Now please refer to FIG. 4. FIG. 4 illustrates a third embodiment of an image sensing device according to the present invention. Similar to the second embodiment, the third embodiment discloses an image sensor 43 having a light-receiving region 431 disposed within an opening of a substrate 42. The image sensor 43 is electrically connected to the substrate 42 by several bonding wires 45. A lens holder 46 is then mounted on the substrate 42. Later, a barrier 48 is formed on the image sensor 43 around the light-receiving region 431. After that, a filler 44 is added between the barrier 48 and the lens holder 46, having the bonding wires 45 being encapsulated. By this way, the filler 44 can not only physically connect the image sensor 43 and the substrate 42 but also protect the bonding wires from being damaged.

Same as the barrier 38 of the second embodiment, the barrier 48 is used to prevent the light-receiving region 431 from being accidentally covered by the filler 44. The barrier 48 is usually made of epoxy resin, solder mask, or photoresist, and can be formed by transfer molding, pot molding, injection molding, photolithographic process, exposure development process, laser cutting process, or stereolithographic process. Due to the fact that the barrier 48 has a certain volume and height, the barrier 48 is usually defined by a photoresist mask. Later, a transparent lid 49 is laid on the barrier 48 above the light-receiving region 431 for protecting the light-receiving region 431 from being damaged or polluted.

In conclusion, the present invention discloses a packaging method for producing an image sensing device having an overall reduced thickness by introducing an adhesive layer for providing a supporting surface for the image sensor which is traditionally performed by a substrate, and removing the adhesive layer afterwards so that the overall thickness of the image sensing device could be reduced. In other words, the overall thickness of the image sensing device of the present invention is thinner than that of a traditional image sensing device at least by the thickness of a substrate.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A packaging method for an image sensing device, comprising the steps of:
    providing an adhesive layer;
    placing a substrate, having an opening, on the adhesive layer;
    disposing an image sensor within the opening on the adhesive layer;
    adding a filler between the image sensor and the substrate;
    connecting the image sensor and the substrate via a plurality of bonding wires; and
    removing the adhesive layer.

2. The packaging method according to claim 1, wherein the image sensor comprises a light-receiving region exposed.

3. The packaging method according to claim 2, further comprising between the disposing step and the adding step a step of forming a barrier around the light-receiving region on the image sensor.

4. The packaging method according to claim 3, further comprising a step of laying a transparent lid on the barrier above the light-receiving region.

5. The packaging method according to claim 3, wherein the barrier is formed by transfer molding, pot molding, injection molding, photolithographic process, exposure development process, laser cutting process, or stereolithographic process.

6. The packaging method according to claim 3, wherein the barrier is defined by a photoresist mask.

7. The packaging method according to claim 3, wherein the barrier is made of epoxy resin, solder mask, or photoresist.

8. The packaging method according to claim 3, wherein the filler is added between the barrier and the substrate with the plurality of bonding wires being encapsulated.

9. The packaging method according to claim 3, wherein the filler is added between the barrier and the substrate with the plurality of bonding wires being exposed.

10. The packaging method according to claim 1, wherein the image sensor comprises complementary metal oxide semiconductor (CMOS) image sensor or charge coupled device (CCD) image sensor.

11. The packaging method according to claim 1, wherein the substrate comprises aluminum nitride ceramic, fiberglass-reinforced epoxy resin, or bismaleimide-triazine resin.

12. The packaging method according to claim 1, further comprising a step of mounting a lens holder on the substrate above the image sensor.

13. The packaging method according to claim 4, further comprising a step of setting a lens on the lens holder.

14. The packaging method according to claim 1, wherein the adhesive layer comprises boron, amorphous silicon, carbon, tantalum nitride, or titanium nitride.

15. The packaging method according to claim 1, wherein the adhesive layer is removed by imposing heat on the adhesive layer to melt an adhesive adhered between the substrate and the image sensor.

16. The packaging method according to claim 1, wherein the adhesive layer is removed by chemical etching to dissolve an adhesive adhered between the substrate and the image sensor.

17. The packaging method according to claim 1, wherein the adhesive layer is a tape.

18. An image sensing device, comprising:
    a substrate having an opening;
    an image sensor disposed within the opening of the substrate;
    a plurality of bonding wires for connecting the image sensor and the substrate; and
    a filler between the image sensor and the substrate.

19. The image sensing device according to claim 18, wherein the image sensor comprises complementary metal oxide semiconductor (CMOS) image sensor or charge coupled device (CCD) image sensor.

20. The image sensing device according to claim 18, wherein the substrate comprises aluminum nitride ceramic, fiberglass-reinforced epoxy resin, or bismaleimide-triazine resin.

21. The image sensing device according to claim 18, further comprising a lens holder mounted on the substrate above the image sensor.

22. The image sensing device according to claim 21, further comprising a lens disposed on the lens holder.

23. The image sensing device according to claim 18, wherein the image sensor comprises a light-receiving region exposed.

24. The image sensing device according to claim 23, further comprising a barrier formed around the light-receiving region on the image sensor.

25. The image sensing device according to claim 24, further comprising a transparent lid laid on the barrier above the light-receiving region.

26. The image sensing device according to claim 24, wherein the barrier is formed by transfer molding, pot molding, injection molding, photolithographic process, exposure development process, laser cutting process, or stereolithographic process.

27. The image sensing device according to claim 24, wherein the barrier is defined by a photoresist mask.

28. The image sensing device according to claim 24, wherein the barrier is made of epoxy resin, solder mask, or photoresist.

29. The image sensing device according to claim 24, wherein the filler is between the barrier and the substrate with the plurality of bonding wires being encapsulated.

30. The image sensing device according to claim 24, wherein the filler is between the barrier and the substrate with the plurality of bonding wires being exposed.

* * * * *